(12) United States Patent
Humphrey et al.

(10) Patent No.: US 11,035,898 B1
(45) Date of Patent: Jun. 15, 2021

(54) DEVICE AND METHOD FOR THERMAL STABILIZATION OF PROBE ELEMENTS USING A HEAT CONDUCTING WAFER

(71) Applicant: International Test Solutions, Inc., Reno, NV (US)

(72) Inventors: Alan E. Humphrey, Reno, NV (US); Jerry J. Broz, Reno, NV (US); Wayne C. Smith, Reno, NV (US); Mark M. Stark, Reno, NV (US)

(73) Assignee: International Test Solutions, Inc., Reno, NV (US)

( * ) Notice: Subject to any disclaimer, the term of this patent is extended or adjusted under 35 U.S.C. 154(b) by 0 days.

(21) Appl. No.: 16/872,292

(22) Filed: May 11, 2020

(51) Int. Cl.
*G01R 31/26* (2020.01)
*G01R 1/073* (2006.01)

(52) U.S. Cl.
CPC ..... *G01R 31/2642* (2013.01); *G01R 1/07342* (2013.01)

(58) Field of Classification Search
CPC .................. G01R 31/2642; G01R 1/07342
USPC .......... 324/750.09, 750.03, 750.01, 537, 500
See application file for complete search history.

(56) References Cited

U.S. PATENT DOCUMENTS

| | | |
|---|---|---|
| 2,971,208 A | 2/1961 | Moore et al. |
| 3,453,677 A | 7/1969 | Cutler |
| 3,675,265 A | 7/1972 | Landen et al. |
| 3,717,897 A | 2/1973 | Strickland |
| 3,945,079 A | 3/1976 | Westberg |
| 4,104,755 A | 8/1978 | Smith |
| 4,277,160 A | 7/1981 | Yamada |
| 4,334,780 A | 6/1982 | Pernick |
| 4,590,422 A | 5/1986 | Milligan |
| 4,832,772 A | 5/1989 | Noguchi et al. |
| 5,011,513 A | 4/1991 | Zador et al. |
| 5,192,455 A | 3/1993 | Marcel |
| 5,205,460 A | 4/1993 | Sato et al. |

(Continued)

FOREIGN PATENT DOCUMENTS

| | | |
|---|---|---|
| CN | 1717285 A | 1/2006 |
| CN | 1889240 A | 1/2007 |

(Continued)

OTHER PUBLICATIONS

International Test Solutions, Probe Clean™ on Silicon Wafer Publication, dated May 2002, 2 pages.

(Continued)

*Primary Examiner* — Giovanni Astacio-Oquendo
(74) *Attorney, Agent, or Firm* — DLA Piper LLP (US)

(57) ABSTRACT

A thermally conductive material, device, and method for predictably maintaining the temperature state and condition of the contact elements and support hardware of a tester interface, such as a probe card, for a testing apparatus, such as automated test equipment (ATE), that has a predetermined configuration applicable for the particular pin contact elements, thermal conditions. The thermally conductive device also has a substrate having a predefined form factor which can be readily introduced into the testing apparatus during normal testing operations. Unlike a patterned substrate that is constrained to specific probe element layouts, the unpatterned surface of the heat conductive device facilitates use with multiple probe card designs within numerous automated test equipment (ATE) tools.

30 Claims, 12 Drawing Sheets

(56) References Cited

U.S. PATENT DOCUMENTS

| | | | |
|---|---|---|---|
| 5,220,279 A | 6/1993 | Nagasawa | |
| 5,444,265 A | 8/1995 | Hamilton | |
| 5,485,949 A | 1/1996 | Tomura et al. | |
| 5,652,428 A | 7/1997 | Nishioka et al. | |
| 5,685,043 A | 11/1997 | LaManna et al. | |
| 5,690,749 A | 11/1997 | Lee | |
| 5,699,584 A | 12/1997 | Wieloch et al. | |
| 5,778,485 A | 7/1998 | Sano et al. | |
| 5,783,018 A | 7/1998 | Gore et al. | |
| 5,814,158 A | 9/1998 | Hollander et al. | |
| 5,930,857 A | 8/1999 | Ramos et al. | |
| 5,968,282 A | 10/1999 | Yamasaka | |
| 6,019,663 A | 2/2000 | Angell et al. | |
| 6,030,674 A | 2/2000 | Onishi et al. | |
| 6,056,627 A | 5/2000 | Mizuta | |
| 6,118,290 A | 9/2000 | Sugiyama et al. | |
| 6,121,058 A | 9/2000 | Shell et al. | |
| 6,130,104 A | 10/2000 | Yamasaka | |
| 6,170,116 B1 | 1/2001 | Mizuta | |
| 6,183,677 B1 | 2/2001 | Usui et al. | |
| 6,193,587 B1 | 2/2001 | Lin et al. | |
| 6,224,470 B1 | 5/2001 | Hoey et al. | |
| 6,280,298 B1 | 8/2001 | Gonzales | |
| 6,306,187 B1 | 10/2001 | Maeda et al. | |
| 6,322,433 B1 | 11/2001 | Matsumura | |
| 6,326,413 B1 | 12/2001 | Blackwell et al. | |
| 6,355,495 B1 | 3/2002 | Fujino et al. | |
| 6,366,112 B1 | 4/2002 | Doherty et al. | |
| 6,474,350 B1 | 11/2002 | Mizuta | |
| 6,523,208 B1 | 2/2003 | Muscato et al. | |
| 6,646,455 B2 | 11/2003 | Maekawa et al. | |
| 6,733,876 B1 | 5/2004 | Beardsley et al. | |
| 6,741,086 B2 | 5/2004 | Maekawa et al. | |
| 6,776,171 B2 | 8/2004 | Carpenter et al. | |
| 6,777,966 B1 | 8/2004 | Humphrey et al. | |
| 6,884,300 B2 | 4/2005 | Sato et al. | |
| 6,888,344 B2 | 5/2005 | Maekawa et al. | |
| 6,960,123 B2 | 11/2005 | Mitarai | |
| 7,202,683 B2 | 4/2007 | Humphrey et al. | |
| 7,254,861 B2 | 8/2007 | Morioka et al. | |
| 7,306,849 B2 | 12/2007 | Buckholtz et al. | |
| 7,530,887 B2 | 5/2009 | Jiang et al. | |
| 7,575,790 B2 | 8/2009 | Terada et al. | |
| 7,621,436 B2 | 11/2009 | Mii | |
| 7,655,316 B2 | 2/2010 | Parkhe | |
| 7,866,530 B1 | 1/2011 | Riachentsev | |
| 7,975,901 B2 | 7/2011 | Maeda et al. | |
| 8,371,316 B2 | 2/2013 | Humphrey et al. | |
| 8,790,466 B2 | 7/2014 | Broz et al. | |
| 8,801,869 B2 | 8/2014 | Broz et al. | |
| 8,876,983 B2 | 11/2014 | Widhalm | |
| 9,093,481 B2 | 7/2015 | Levinson | |
| 9,131,829 B2 | 9/2015 | Namikawa et al. | |
| 9,318,362 B2 | 4/2016 | Leung et al. | |
| 9,452,455 B2 | 9/2016 | An et al. | |
| 9,825,000 B1 | 11/2017 | Humphrey et al. | |
| 9,831,215 B1* | 11/2017 | Chen | H01L 21/56 |
| 9,833,818 B2 | 12/2017 | Humphrey et al. | |
| 9,933,457 B2 | 4/2018 | Leikermoser et al. | |
| 9,941,148 B2 | 4/2018 | Gratix | |
| 10,195,648 B2 | 2/2019 | Broz et al. | |
| 10,239,099 B2 | 3/2019 | Humphrey et al. | |
| 10,361,169 B2 | 7/2019 | Humphrey et al. | |
| 10,399,809 B2 | 9/2019 | Montoya et al. | |
| 10,406,568 B2 | 9/2019 | Humphrey et al. | |
| 10,792,713 B1 | 10/2020 | Humphrey et al. | |
| 2001/0007421 A1 | 7/2001 | Marcuse et al. | |
| 2002/0028641 A1 | 3/2002 | Okubo et al. | |
| 2002/0079349 A1 | 6/2002 | Macover | |
| 2002/0096187 A1 | 7/2002 | Kuwata et al. | |
| 2002/0097060 A1 | 7/2002 | Maekawa et al. | |
| 2002/0112300 A1 | 8/2002 | Muhr-Sweeney | |
| 2003/0027496 A1 | 2/2003 | Back et al. | |
| 2003/0076490 A1 | 4/2003 | Clark | |
| 2003/0092365 A1 | 5/2003 | Grube | |
| 2003/0138644 A1 | 7/2003 | Khandros et al. | |
| 2003/0200989 A1 | 10/2003 | Humphrey et al. | |
| 2004/0083568 A1 | 5/2004 | Morioka et al. | |
| 2004/0096643 A1 | 5/2004 | Sato et al. | |
| 2004/0200515 A1 | 10/2004 | Saito et al. | |
| 2005/0001645 A1 | 1/2005 | Humphrey et al. | |
| 2005/0026552 A1 | 2/2005 | Fawcett et al. | |
| 2005/0034743 A1 | 2/2005 | Kim et al. | |
| 2005/0118414 A1 | 6/2005 | Namikawa et al. | |
| 2005/0126590 A1 | 6/2005 | Sato et al. | |
| 2005/0255796 A1 | 11/2005 | Haga | |
| 2006/0029441 A1 | 2/2006 | Atsushi et al. | |
| 2006/0065290 A1 | 3/2006 | Broz et al. | |
| 2006/0076337 A1 | 4/2006 | Brunner et al. | |
| 2006/0151004 A1 | 7/2006 | Terada et al. | |
| 2006/0219754 A1 | 10/2006 | Clauberg et al. | |
| 2006/0272678 A1 | 12/2006 | Corrado et al. | |
| 2006/0289605 A1 | 12/2006 | Park et al. | |
| 2007/0140754 A1 | 6/2007 | Poxon et al. | |
| 2007/0153062 A1* | 7/2007 | Shie | B41J 2/1603 347/56 |
| 2007/0178814 A1 | 8/2007 | Sato et al. | |
| 2007/0284419 A1 | 12/2007 | Matlack et al. | |
| 2008/0023028 A1 | 1/2008 | Fujita | |
| 2008/0070481 A1 | 3/2008 | Tamura et al. | |
| 2008/0242576 A1 | 10/2008 | Tamura et al. | |
| 2009/0197404 A1* | 8/2009 | Yang | H01L 21/76831 438/652 |
| 2009/0212807 A1 | 8/2009 | Chen et al. | |
| 2009/0227048 A1 | 9/2009 | Fang et al. | |
| 2009/0248128 A1* | 10/2009 | Nassif | A61N 1/3904 607/142 |
| 2010/0132736 A1 | 6/2010 | Lin et al. | |
| 2010/0149785 A1* | 6/2010 | Dubuc | F21V 29/90 362/92 |
| 2010/0210079 A1* | 8/2010 | Masuoka | H01L 29/78642 438/156 |
| 2010/0258144 A1 | 10/2010 | Broz et al. | |
| 2010/0294435 A1 | 11/2010 | Maeda et al. | |
| 2011/0132396 A1 | 6/2011 | Humphrey et al. | |
| 2012/0266461 A1* | 10/2012 | Nickut | B23K 26/361 29/840 |
| 2012/0299175 A1* | 11/2012 | Tran | B82Y 30/00 257/712 |
| 2013/0056025 A1 | 3/2013 | Widhalm | |
| 2013/0336689 A1 | 12/2013 | Swing et al. | |
| 2013/0336699 A1 | 12/2013 | Vo et al. | |
| 2014/0191618 A1* | 7/2014 | Kijima | H01L 41/257 310/357 |
| 2014/0331421 A1 | 11/2014 | Broz et al. | |
| 2015/0187617 A1 | 7/2015 | Leung et al. | |
| 2015/0191654 A1* | 7/2015 | Wang | C10B 21/16 202/117 |
| 2015/0214095 A1* | 7/2015 | Mischitz | H01L 23/562 438/660 |
| 2016/0131702 A1* | 5/2016 | Sinsheimer | H01L 25/50 324/750.03 |
| 2017/0010306 A1* | 1/2017 | Na | G01R 31/2875 |
| 2017/0203322 A1 | 7/2017 | Ivri et al. | |
| 2017/0239695 A1 | 8/2017 | Hamilton | |
| 2018/0017748 A1 | 1/2018 | Mir et al. | |
| 2018/0125284 A1* | 5/2018 | Cave | A47J 27/21058 |
| 2019/0262871 A1 | 8/2019 | Stark et al. | |
| 2019/0262872 A1 | 8/2019 | Stark et al. | |
| 2019/0263613 A1 | 8/2019 | Stark et al. | |
| 2019/0263614 A1 | 8/2019 | Stark et al. | |
| 2020/0200800 A1 | 6/2020 | Stark et al. | |
| 2020/0388590 A1 | 12/2020 | Jindo et al. | |
| 2021/0005483 A1 | 1/2021 | Humphrey et al. | |

FOREIGN PATENT DOCUMENTS

| | | |
|---|---|---|
| CN | 103831676 A | 6/2014 |
| DE | 202004009619 U1 | 9/2004 |
| DE | 102005052308 A1 | 5/2007 |
| GB | 2532255 A | 5/2016 |
| JP | S5788742 A | 6/1982 |
| JP | S58131743 A | 8/1983 |

(56) References Cited

FOREIGN PATENT DOCUMENTS

| | | |
|---|---|---|
| JP | S63204728 A | 8/1988 |
| JP | H05211195 A | 8/1993 |
| JP | H07244074 A | 9/1995 |
| JP | H11145212 A | 5/1999 |
| JP | 2000232125 A | 8/2000 |
| JP | 2000332069 A | 11/2000 |
| JP | 2005326250 A | 11/2005 |
| JP | 2006013185 A | 1/2006 |
| JP | 2006165395 A | 6/2006 |
| JP | 2006186133 A | 7/2006 |
| JP | 2008070280 A | 3/2008 |
| JP | 2008147551 A | 6/2008 |
| JP | 2008270270 A | 11/2008 |
| JP | 2011117938 A | 6/2011 |
| JP | 4840118 B2 | 12/2011 |
| JP | 2014107561 A | 6/2014 |
| JP | 6067951 B1 | 1/2017 |
| KR | 100392730 B1 | 7/2003 |
| KR | 20070074426 A | 7/2007 |
| KR | 100889297 B1 | 3/2009 |
| KR | 20110063275 A | 6/2011 |
| KR | 20140066450 A | 6/2014 |
| KR | 20170127650 A | 11/2017 |
| KR | 20180108396 A | 10/2018 |
| TW | 409322 B | 10/2000 |
| WO | WO 9847663 A1 | 10/1998 |
| WO | WO 2010030052 A1 | 3/2010 |
| WO | WO 2012032481 A1 | 3/2012 |

OTHER PUBLICATIONS

International Test Solutions Publication, Probe Clean™ for Use on Prober Abrasion Plates, dated May 2002, 2 pages.
International Test Solutions Publication, Probe Clean™ Non-Abrasive Method to Clean Loose Debris from Probe Tips, dated May 2002, 1 page.
International Test Solutions Publication, Probe Polish™ on Silicon Wafer, dated May 2002, 2 pages.
International Test Solutions Publication, Probe Polish™ for Use on Prober Abrasion Plates, dated May 2002, 2 pages.
International Test Solutions Publication, Probe Scrub™ Restore Probe Tip Performance and Remove Bonded Debris, dated May 2002, 1 page.
International Test Solutions, Probe Form™ Publication, dated Jul. 7, 2005, 2 pages.
International Test Solutions, Cleaning Parameters for TEL Probers P8 and P8-XL Publication, dated printout dated Sep. 18, 2003, 3 pages. http://web.archive.org/web/20030918014522/http://inttest.net/products/PC2002.pdf.
Anonymous: "Wire Bonding"—Wikipedia—Retrieved from the Internet, 2 pages. https://en.wikipedia.org/wiki/Wire_bonding\.
Neware, Pallawi, B., et al, "Flexible Organic Light Emitting Diodes-FOLED," Oct. 26, 2015, vol. 5, No. 5, pp. 3457-3462.
Zhao, L., et al., "Novel Method for Fabricating Flexible Active Matrix Organic Light Emitting Diode (AMOLED) Displays," Sep. 21, 2011, 5 pages.
Margaret Rouse, Definition "end effector" from WhatIs.com, Feb. 26, 2009, retrieved on Nov. 7, 2019, 2 pages. http://whatis.techtarget.com/definition/end-effector?vgnextfmt=print.
Istvan Benedek and Luc J. Heymans, "Pressure-Sensitive Adhesives Technology", 1997, Marcel Dekker, Inc., Chapter 6, pp. 186-187. (Year: 1997).
American Society for Testing and Materials, Standard Test Methods of Liner Removal at High Speeds from Pressure-Sensitive Label Stock, Designation: D5375/D5375M -98, current edition approved Apr. 10, 1998, Annual Book of ASTM Standards, vol. 14.02., 3 pages.
ASTM International, Standard Terminology of Adhesives, Designation: D907-15, current edition approved Sep. 15, 2015, 13 pages.
ASTM International, Standard Test Method for Loop Track, Designation: D6195-03, current edition approved Apr. 1, 2011, 5 pages.
ASTM International, Standard Test Method for Pressure-Sensitive Tack of Adhesives Using an Inverted Probe Machine, Designation: D2979-16, current edition approved Oct. 1, 2016, 3 pages.

* cited by examiner

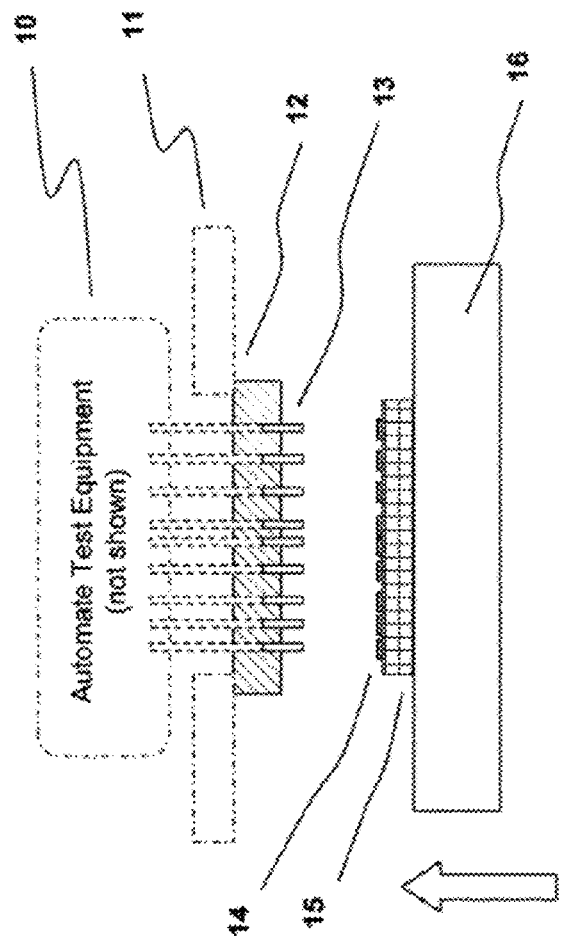
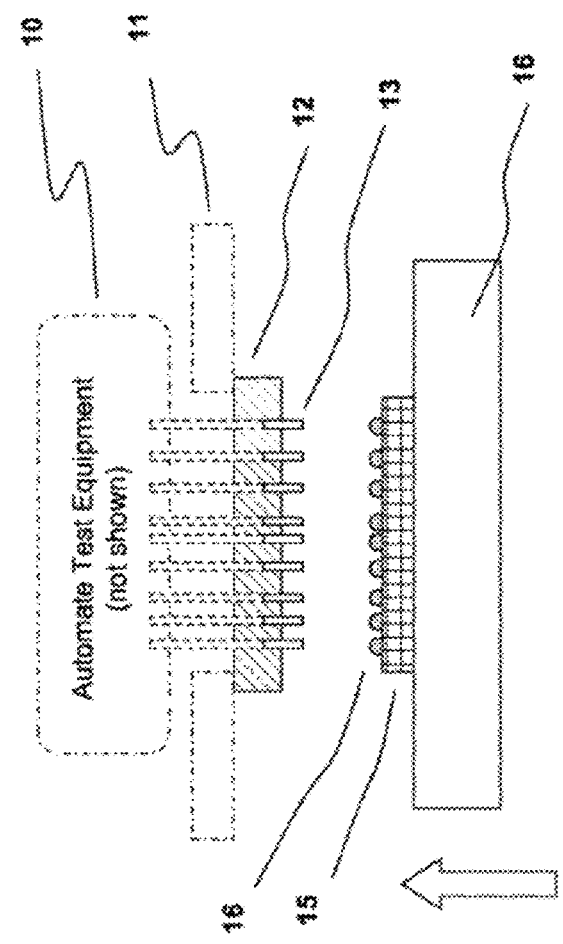
Figure 1A
Prior Art
Figure 1B
Prior Art

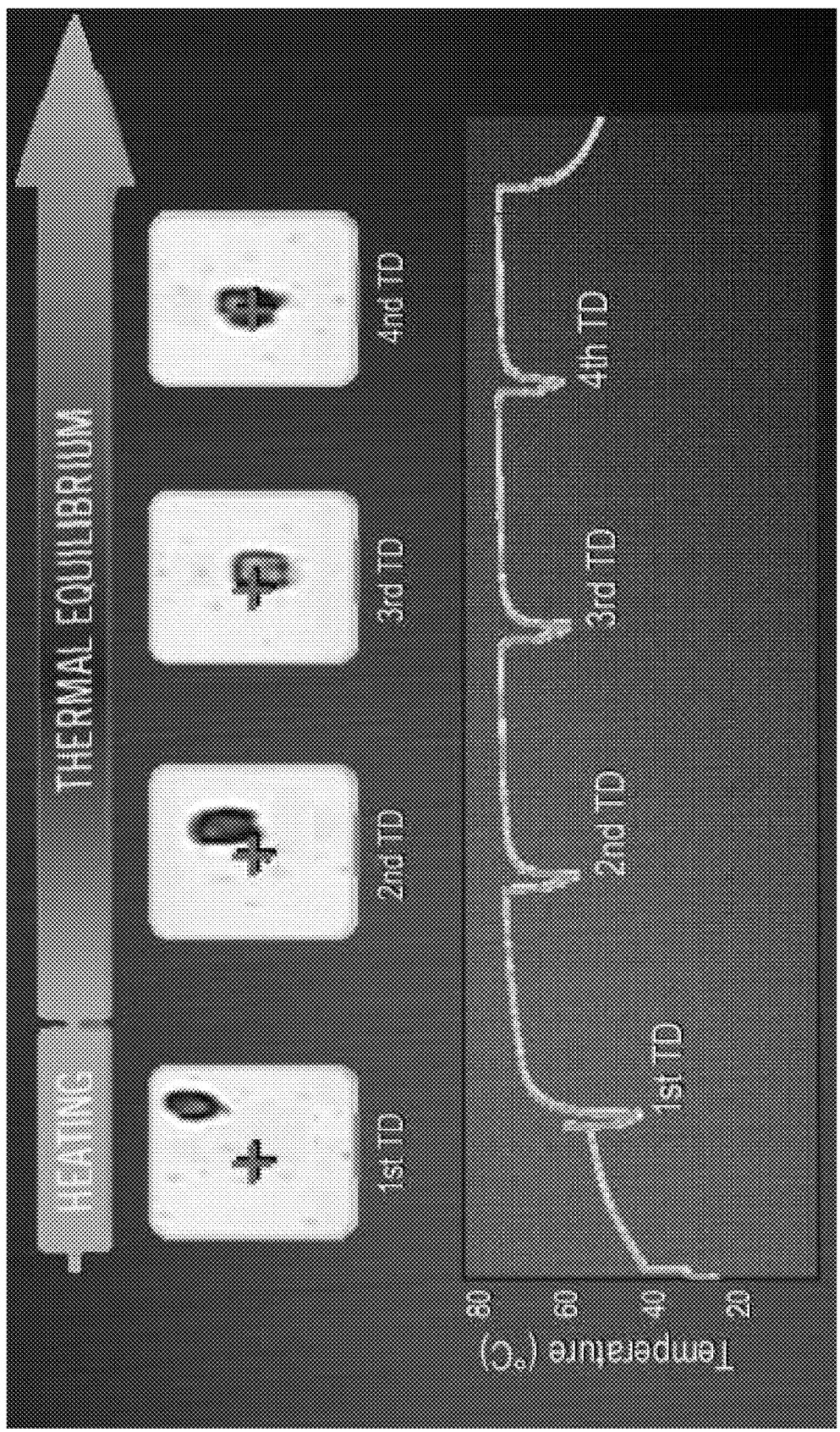
Figure 2 (prior art) - Thermal Equilibrium vs Probe Placement

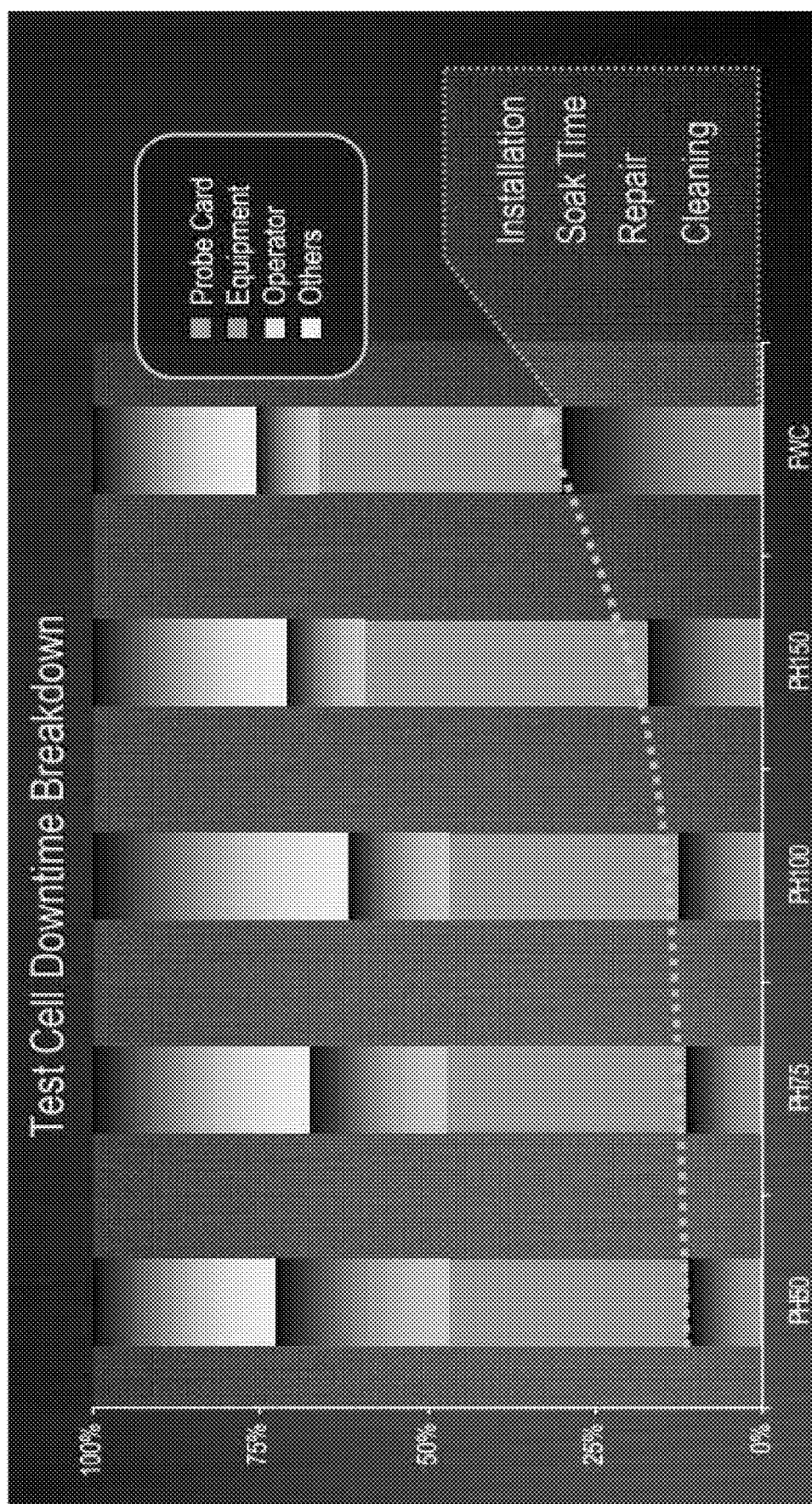
Figure 3 (prior art) - Thermal Equilibrium vs Probe Placement

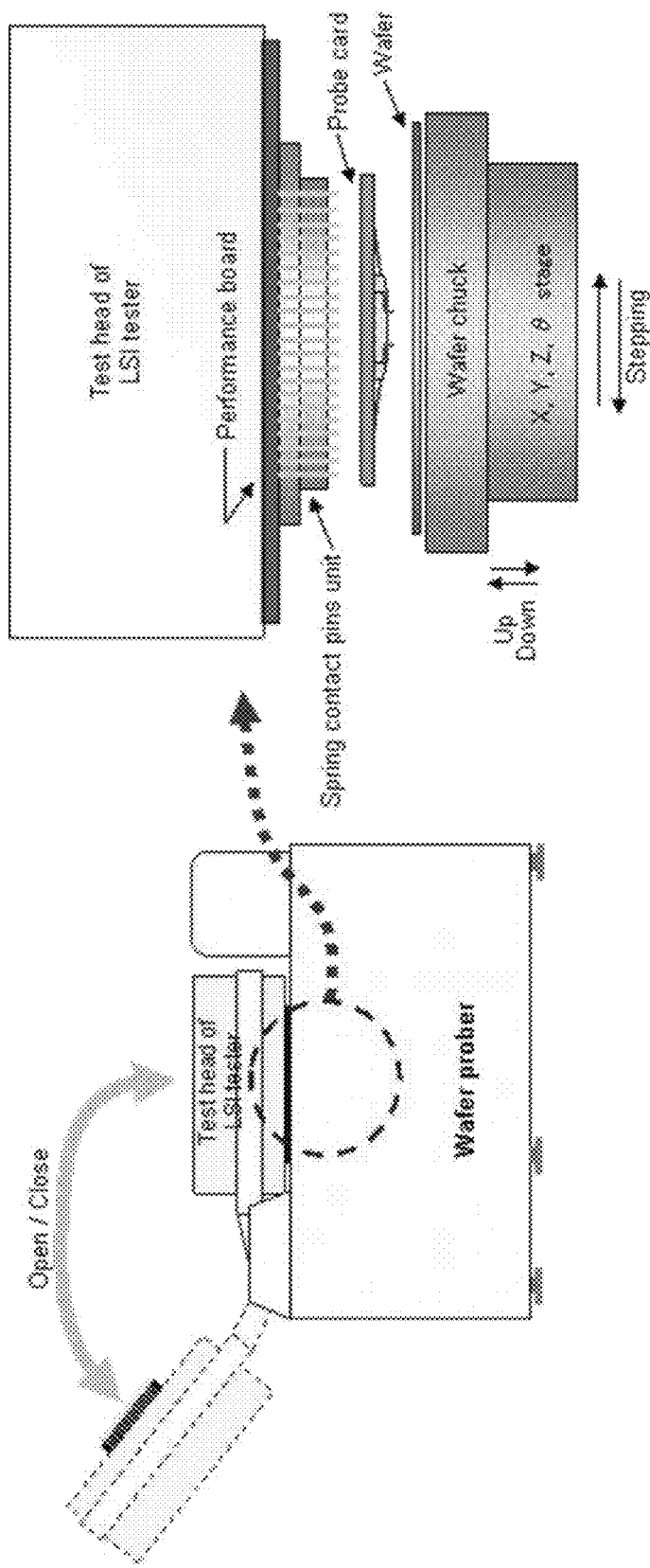
Figure 4 (Prior Art) - Thermal Soak Using Radiant Heat from Wafer Chuck

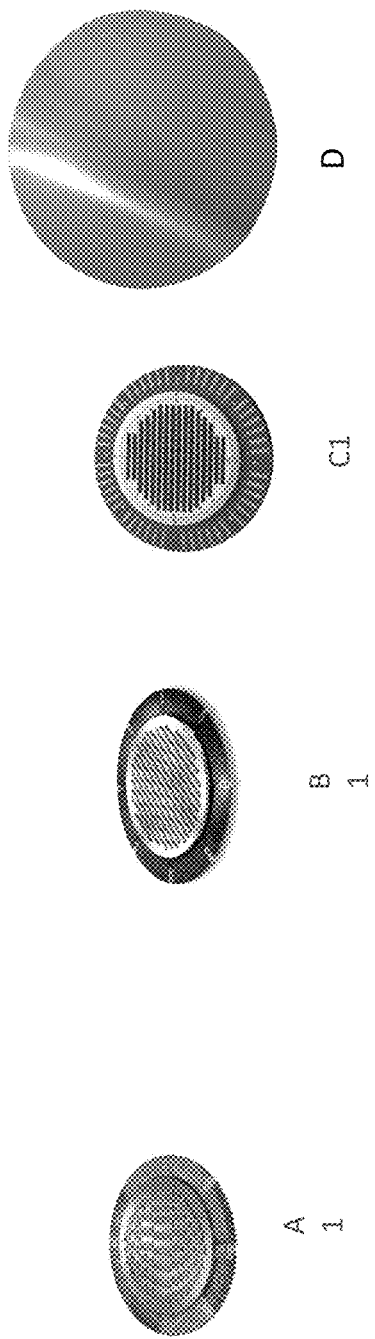
Figure 5 (Prior Art) – Blank Silicon Wafer

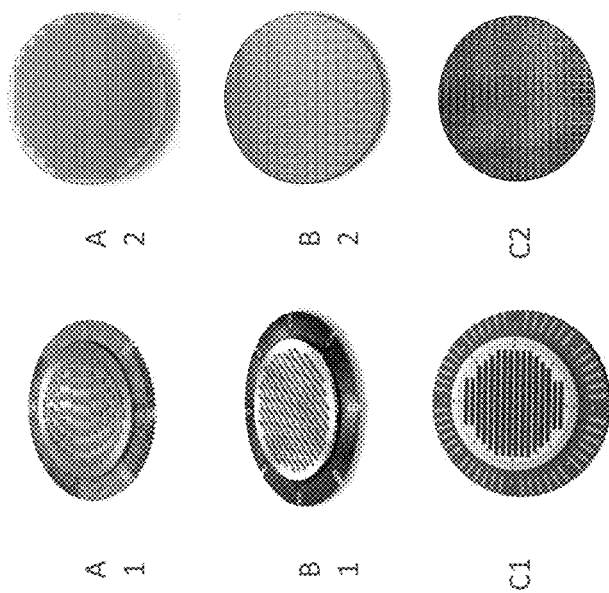
Figure 6 (Prior Art) - Thermal Soak Using Scrapped or Rejected Patterned Wafer Figure 9 – Wafer with thermally conductive film

300mm DRAM Fab – Thermal Stabilization

- Normal Stabilization after idle – Long Soak time on wafers before running production
- Tool in standby with probe card on HCW wafer and production could be started without requiring long soak time

| | w/o HCW | w/ HCW |
|---|---|---|
| Preheat duration | 40min | 6min |
| Contamination | High risk | No risk |
| Probe wearable | High risk | Low risk |
| Wafer Requirement | Device dependent | One HCW for all probecard designs |

Figure 12

DEVICE AND METHOD FOR THERMAL STABILIZATION OF PROBE ELEMENTS USING A HEAT CONDUCTING WAFER

FIELD

The disclosure relates generally to a material, device, and method for predictably and consistently attaining a predetermined thermal state and condition of interface contact elements and the support hardware used for semiconductor device electrical testing.

BACKGROUND

In a parametric test, wafer level test, and device level test, the conventional interface hardware for a piece of testing equipment is a "probe card" that has a plurality of probe elements, that match the layout of the device under test (DUT) input/output (I/O) pads, connected to the probe card. More specifically, in the typical wafer testing process, the probe card is mounted into the prober, and probe contact elements (simply referred to as "probes") are brought into contact with bonding pads, solder balls and/or gold bumps formed on the dies of the wafer. To maintain critical cost of test metrics and facilitate test parallelism, the probe cards used for the testing application can be designed with multiple sites (multisite testing) for both non-memory and memory testing. In high volume memory device testing processes, the probe card can be designed such that all devices on the semiconductor wafer are contacted simultaneously by the probe card, or full-wafer-contactor. With a massively parallel designed probe card, excessive downtime due to non-probing operations will affect throughput and substantially increase the overall Cost of Test (CoT).

During the testing process (as shown in FIGS. 1A and 1B), as the pin elements 13, or probe, make contact onto the bond pads 14, solder balls 16, pillars, copper-pillar bumps, and/or gold bumps on a semiconductor device under test (DUT) 15, the tip area of each pin element will "scrub" across the contact surface of the bond pad, etc. of the DUT 15 to create "scrub marks". A major challenge encountered with high volume IC testing processes (die level and wafer level) is ensuring consistent probe-to-pad-alignment (PTPA) within the prober for optimal "scrub" of the probe tips against the bonding pads, solder balls, pillars, copper-pillar bumps, and/or gold bumps for attaining electrical contact between the contact pins associated with the contactor element, and the contact surfaces of the DUT 15. By exerting controlled displacement of the probe tips against the bonding pads 14, solder balls 15, pillars, copper-pillar bumps, and/or gold bumps, an electrical connection is achieved allowing the power, ground and test signals to be transmitted. Misalignment of the probe to the pads can create excessive pad damage that will affect the assembly (wire bonding, flip-chip, etc.) of the devices during prior to final packaging.

High performance demands for wafer level contactor technologies have furthered the development of uniquely shaped and customized contact elements with predetermined elastic properties and engineered mechanical performance. Many of the new advanced contact technologies have unique contact element geometries and mechanical behavior to facilitate consistent, repeatable, and stable electrical contact. Some of the technologies are constructed using advanced lithographic assembly techniques, some are built using MEMS based processes; while others are fabricated with high accuracy micro-machining techniques.

Wafer level testing operations at low and/or elevated temperatures are required to assure and facilitate proper test program execution, device fault identification, as well as assess long-term reliability of the device. Depending upon the device or product requirements, the wafer-level and/or die-level can be performed at temperatures at T=−55 C (or lower) or at T=200 C (or higher). Attaining accurate and consistent PTPA during wafer testing becomes increasingly difficult under the thermal testing conditions necessary for identifying performance faults within the performance of the semiconductor devices.

In general, probe cards are designed such that the probe tips will be well-centered within the probe pad during the test execution; however, it is well-known that dimensional changes and thermally induced displacement of the probe card, the docking hardware, and the test cell will occur during the heating and cooling process. Fluctuations from the equilibrium temperature can result in expansion and/or contraction of the various hardware within the test cell. Such thermally induced dimensional changes can have dramatic effects on the probe-to-pad-alignment (PTPA) during testing.

In FIG. 2 (from a presentation of Harker et al. "Improving Scrub Performance and Reducing Soak Time with a New Mechanism to Stabilize Probe Card Temperature", IEEE SW Test Workshop, 2009), the variations of scrub location (probe marks) versus thermal state of a full wafer contactor are highlighted. Actual scrub marks within probe-pads from a full-wafer-contactor that is being used for high volume testing under elevated temperature conditions are shown and ideally each of the four touchdowns ($1^{st}$ TD-$4^{th}$ TD) should be directly on an exact center of the bond pad that is indicated with the centered crosshairs in FIG. 2. During the heating step ($1^{st}$ TD reference), it is clear that the scrub mark is not well aligned to the crosshairs at the bond pad center. As the thermal equilibrium of the test cell is approached, the alignment of the scrub mark to the bond pad center consistently improves ($2^{nd}$ TD and $3^{rd}$ TD). Once the thermal equilibrium of the test cell and the probe card is attained, the scrub mark ($4^{th}$ TD) is well-centered with the bond pad.

Due to the fluctuations in the probe element and probe card temperatures, inconsistent scrub marks can be observed after a LOT change, a wafer change, probe mark inspection execution, probe cleaning, and after a period of idle time. It is important to minimize the amount of time needed to recover thermal equilibrium during probing. Variations in the probe mark alignment induced by temperatures changes occur regardless of the probe technology or the probe card design. With full wafer contactors, the misalignment can be as much as 15 um to 25 um and with smaller pad sizes, a few microns of change and misalignment can create quality issues which could lead to long-term reliability issues after device packaging.

As part of the test process under low or elevated temperatures, a "temperature-soak time" will be implemented such that the test-cell comes to a thermally stable condition at some predetermined target temperature. The soak time required can last several hours. The semiconductor device testing cannot be performed until the target temperature is attained and the overall cost of test will dramatically increase since this delay will affect the throughput and productivity of the test-cell. The reduction in productivity is summarized In FIG. 3 (from a presentation of Harker et al. "Improving Scrub Performance and Reducing Soak Time with a New Mechanism to Stabilize Probe Card Temperature", IEEE SW Test Workshop, 2009). In this figure, PH50 indicates a 50 mm×50 mm probe array, PH75 indicates a 75 mm×75 mm probe array, PH100 indicates a 100 mm×100 mm probe array, PH150 indicates a 150 mm×150 mm probe array and the FWC indicates a full wafer, or a 300 mm probe array contactor. As shown in FIG. 3, the amount of test cell downtime due to initial and recovery soak-time required after installation, repair, and, cleaning dramatically increases with the size of the contactor array.

In response to the problem of long-term probe card and hardware soak time required for test-cell stabilization, several techniques have been utilized by test floor engineers and developed by probe card manufacturers. To reduce the amount of initial and recovery soak time needed, several probe card manufacturers have developed heater elements that can be incorporated into the probe card design. These heater elements are a design feature that is incorporated at additional cost and must be defined during the initial fabrication process; however, these elements are applicable for only a subset of the full-wafer contactor design. For existing full-wafer-contactors, these heating elements cannot be retrofit into the probe card construction. Alternatively, ATE tester suppliers have developed heaters that can be incorporated within the probe card, PCB, interface stack and the test-head; however, this additional hardware is a significant cost adder to the overall cost of the test and is not backwards compatible for older, legacy testers.

In one conventional method for probe card thermal soaking using radiant heating shown in FIG. 4, the prober wafer chuck is positioned directly under the probe card and moved into extremely close proximity of the probe card. In one instance, the wafer chuck can be bare (i.e., there is no wafer vacuumed onto the chuck), or loaded with a blank or product that is held on the chuck via standard vacuum. In this case, the wafer chuck is utilized to act as thermal source within the prober for the entire test cell. As the temperature of the wafer chuck is increased, it functions as a radiant thermal source and directly heats the probe card as well as all other hardware (i.e., headplate, probe-card pan, etc.) until a stable target temperature for the test-cell is attained. If the wafer chuck is bare (i.e., without a wafer), there is a risk of probe card damage due to differences in coplanarity across the probe-card or changes in the vertical alignment as the hardware expands and contracts under the thermal loading. Using a bare-chuck method, any probe card design could be radiantly heated until the target temperature is reached. After a long soak time, a product wafer will be loaded onto the wafer chuck; however, the probe-card will cool upon removal of the heat-source and fall below the target temperature. Similarly, using a product wafer method, the specific probe card design associated with the device under test would be heated and located below the probe card until the target temperature is reached. Due to the long times needed to reach the equilibrium temperatures, the radiant method of probe card heating is typically not used when high temperature testing is required.

In another conventional method of heating, the probe card uses conductive heating shown in FIG. 5, a blank silicon wafer (D) is loaded onto the wafer chuck. In this method, the wafer chuck and vacuumed wafer is positioned directly under the probe card, and over-travelled in the z-direction until all the probes of the card make physical contact with the surface of the blank silicon wafer. The blank wafer is held in physical contact with the probes to facilitate the thermal transfer across the wafer thickness from the wafer chuck to the probe card. The conductive thermal transfer with a probe card over travelled onto a blank in FIG. 5 is more efficient than the radiant heating in FIG. 4 such that the soak time can be reduced. Using this method, a silicon wafer can be used for multiple probe card layouts (A1, B1, and C1) and probe-element geometries; however, there are high risks for potential damage to the probe card associated with application of the overtravel with such a wafer. The surface of the wafer must be recognized with the prober look-down camera to accurately define the contact plane. If the contact plane is not accurately defined, there is a risk of excessive overtravel that could permanently or catastrophically damage the probe card. Enough overtravel must be applied to ensure all probes are in contact across the probe array; however, due to this contact, probe scrubbing will occur across the surface of the wafer. The scrubbing action across the wafer surface can result in probe tip contamination, material transference from the wafer, and probe tip or probe contact surface damage. Furthermore, adherent contamination could require probe tip cleaning prior to wafer probing to prevent yield fallout due to compromised electrical contact and high contact resistance.

In another conventional method using conductive heating shown in FIG. 6, a scrapped or rejected patterned wafer is loaded onto the wafer chuck, aligned to the probe card, and an overtravel in the z-direction is applied until all the probes make physical contact with the bond pads of the devices on the wafer. For this method, the device and pad layouts on the wafer must identically match the probe card array layout and device configuration. For example, the device and layout geometries for the probes of Probe Cards A1, B1, and C1 must match exactly the device and bond pad layout geometries from Wafers A2, B2, and C2, respectively. For example, Wafer A2 could not be used with Probe Card B1, Wafer B2 could not be used with Probe Card A1, etc. A dedicated wafer for each device layout geometry must be used to avoid probe card damage. In this method, an overtravel is implemented and the scrapped wafer is held in physical contact with the probes to facilitate heat transfer through the wafer from the wafer chuck to the probe card. Additionally, there are risks associated with application of the overtravel onto the pads of the scrapped devices. As the probes are brought in contact with the pads, the probes will be scrubbing across the pads and generating adherent debris as well as other contaminants. The scrubbing on the bond pads during overtravel and additional scrub created by repeated expansion or contraction of the interface stack during the soak could result in probe tip contamination, material transference, and probe tip or contact surface damage. Multiple, repeated scrubs in the same would also create additional debris and adherent materials. Furthermore, adherent contamination could require probe tip cleaning prior to wafer probing to prevent yield fallout due to compromised electrical contact and high contact resistance. Cleaning execution will affect the stability of the thermal soaking and additional steps are needed to recover the probe-to-pad-alignment (PTPA).

None of the existing conventional procedures that use radiant or conductive heating of the probe card and hardware adequately address a device and method which incorporates wafer with a thermally conductive, non-transferring, and complaint film with predetermined properties that protects probes from damage and contamination during the soak time. The process of probe card cleaning after thermal soaking is not desirable and an efficient method for thermal soaking without scrubbing against a bare silicon wafer or bond pads of scrapped wafer is needed. It is desirable to reduce the soak time (not provided by the conventional systems and methods) that would have significant benefits for reduced cost to test and increased throughput for advanced semiconductor devices.

BRIEF DESCRIPTION OF THE DRAWINGS

FIG. 1A and FIG. 1B illustrate a conventional example of the testing of probe pads or probe bumps of a device under test, or DUT, respectively;

FIG. 2. illustrates probe marks (or scrub marks) created by the probes of a probe card during wafer level testing;

FIG. 3 illustrates the amount of downtime associated with various procedures and processes during the wafer-level testing operation and thermal soak-time is a major contributor to the downtime and will have a deleterious effect on the throughput and overall cost of test;

FIG. 4 Illustrates a conventional wafer-level test-cell that includes a wafer prober, automated test equipment (ATE), a probe card, and prober and the wafer chuck that can be heated or cooled to a target temperature and moved to a location directly below the probe-card such that a target temperature is attained by radiant heating;

FIG. 5 shows three different probes cards (A1, B1, and C1) and a blank silicon wafer (D) in which the blank wafer can be loaded onto the heated wafer chuck of the prober and the wafer chuck would be positioned directly below the probe-card and a z-overtravel applied until all probes contact the wafer surface;

FIG. 6 shows three different probes cards (A1, B1, and C1) and three different scrapped, rejected, or patterned wafers (A2, B2, and C2) in which the probe-cards are uniquely matched and dedicated to the wafers such that the probe touchdown on the appropriate pads with the wafer chuck positioned directly below the probe-card and a z-overtravel applied until all probes contact the wafer surface;

FIG. 12 shows an 8× reduction of soak time during DRAM Device Testing in which the HCW usage vs. the soak time without HCW usage while the prober is in standby mode, or idle.

DETAILED DESCRIPTION OF ONE OR MORE EMBODIMENTS

Figure 7:
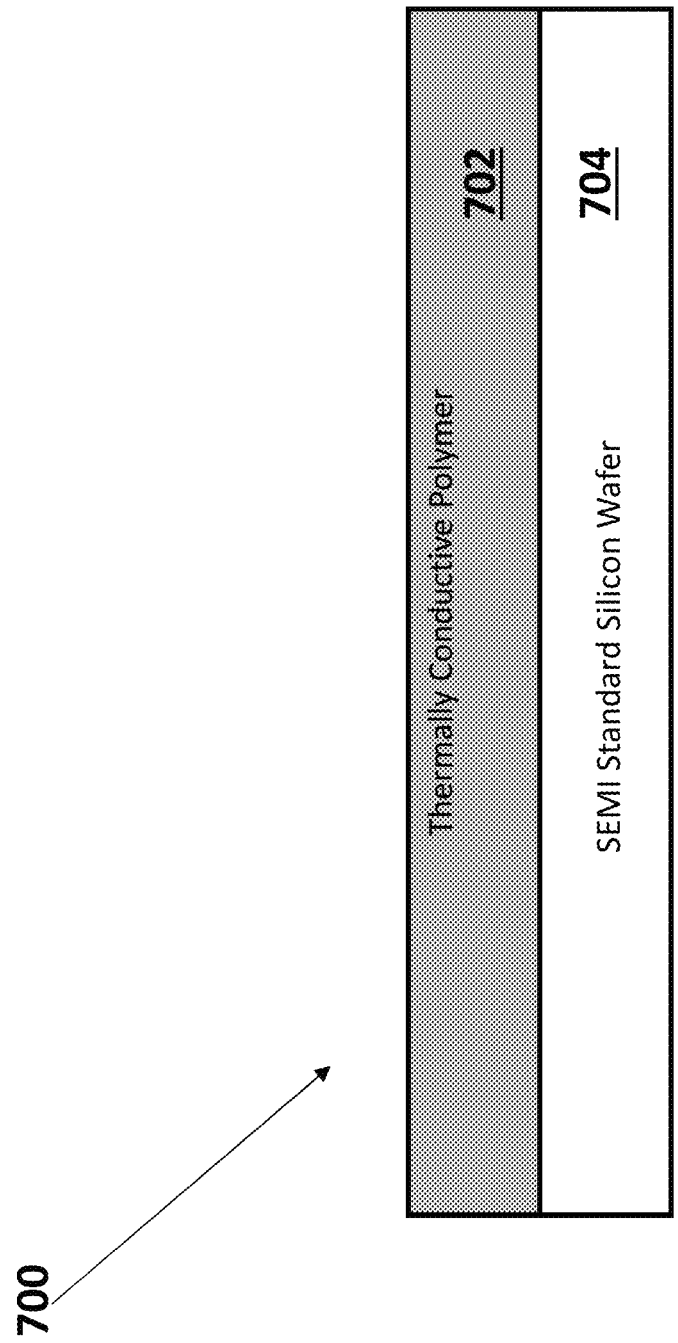
FIG. 7 illustrates an example of a heat conductive device 700, such as a heat conductive wafer (HCW) with a thermally conductive layer (702) applied onto a SEMI standard wafer (704) that can reduce the soak time needed for probe cards.

The disclosure is particularly applicable to a heat conductive wafer, device and method for reducing soak time in a probe card assembly and it is in this context that the disclosure will be described. The disclosure is also particularly applicable to a material, device, and method for predictably and consistently maintaining the thermal state and condition of probe cards having predetermined layouts, geometries, probe types, and mechanical performance that are used for high temperature and/or low temperature large area array wafer level testing of memory and non-memory semiconductor devices. It will be appreciated, however, that the heat conductive wafer, device and method has greater utility since it can be used to reduce the soak time (establish thermal equilibrium) for other testing apparatus and other processes and machines in the semiconductor manufacturing process and can have different configurations that are well within the scope of this disclosure.

For wafer level test above and/or below ambient temperatures, the contact elements of the probe cards can be a variety of different test probes, such as MEMS type microcantilever probes and MEMS type vertical probes, vertical wire probes, cobra probes, spring probes, contact bump probes formed on a membrane, wired cantilevered, etc. The associated support structures can be any type of interface typically used in probe card construction, such as ceramic or organic space transformers, probe interface boards, stiffeners, printed circuit boards, etc., that are used to support the probe card within the test-cell. It is in this context that the disclosure will be described; however, it can be appreciated that the thermally conductive material layer, the device, and method have greater utility for maintaining thermal stability of other test devices and interfaces utilized in IC semiconductor evaluation equipment.

A thermally conductive material, device, and method for predictably maintaining the temperature state and condition of the contact elements and support hardware of a tester interface, such as a probe card, in which the conductive device has a predetermined configuration applicable for the particular pin contact elements, thermal conditions, and a substrate having a predefined form factor which can be readily introduced into the testing apparatus under normal testing operations. Unlike a patterned substrate that is constrained to specific probe element layouts, the un-patterned surface of the heat conductive device facilitates use with multiple probecard designs within numerous automated test equipment (ATE) tools that populate testfloor. The conductive material installed onto the surface of the substrate results in a device that provides enhanced thermal performance characteristics that are not possible with a blank wafer substrate. The material can also be configured with a plurality of various thermally conductive particles to further enhance the thermal conductivity. The conductive device can be used during the normal operation of the testing machine while it is in manual, semi-automated, and automated handling device and the electrical test equipment.

FIG. 7 illustrates an example of a heat conductive device 700, such as an exemplary heat conductive wafer (HCW) that reduces the soak time for probe cards. The HCW is ideally designed for probe cards that require soaking for thermal stabilization and thus can be used in ATE tools and/or testers for massively parallel testing of memory integrated circuits, such as DRAM or SRAM, and other large area array integrated circuit devices that require stable high temperature testing. The HCW may be used, for example, during any event in which the temperature of the probe card may change (increase and/or decrease), such as during maintenance, during idle times and/or during a lot change process.

A heat conductive layer 702 may be made of a solid elastomeric material with predetermined thermal conductivity, elasticity, density and surface energy parameters that allow the probes make contact and deform film without damage to the geometry of the contact elements. For example, the heat conductive polymer layer can have predetermined properties for elongation at break of a range for 8-70%, a Rockwell hardness of E52 to 99, a coefficient of thermal expansion of 30 to 60×10−6 K−1, a thermal conductivity @23 C of 0.10 to 0.45 W m−1 K and upper working temperature of 250 to 320 C. The heat conductive layer should be not be penetrated with the tips of the probe elements during overtravel. Since the probe do not penetrate into the polymer, there a low likelihood that any polymer material would be transferred to the probe contact elements. In the embodiment shown in FIG. 7, the single complaint layer could be a high-purity, electronic grade polyimide polymer of imide monomers that contains no contaminants and has thermal stability, chemical resistance, and mechanical properties.

As shown in FIG. 7, the HCW in one embodiment may have a thermally conductive layer 702, that may be a polymer, that rests on top of a wafer 704, such as a SEMI standard silicon wafer. The HCW 700 may have a shape and configuration such that it can be used by the testing apparatus during normal operation so that the thermal conditioning may be done without having to insert a special device or wafer as is done with the conventional systems and methods. In one example, the HCW 700 may have a total thickness of 795 µm thick (+/−17 µm) in which the polymer layer 702 has a thickness of 20 µm (+/−2 µm) and the wafer has a thickness of 775 µm (+/−15 µm). In one embodiment, the polymer layer 702 may be a spin-coat polymer that has low tack and maximum temperature of 300 degrees Celsius.

In one example embodiment, the substrate 704, a silicon wafer in this example, used for this application would be within the SEMI standard, as outlined below for 150 mm, 200 mm, and 300 mm silicon wafer per *SEMI M1-Specification for Polished Single Crystal Silicon Wafers*.

| WAFER | 150 mm | 200 mm | 300 mm |
|---|---|---|---|
| Thickness | 675 mm | 725 mm | 775 mm |
| Tolerance | +/−20 µm | +/−20 µm | +/−20 µm |

The thickness of the polymer layer 702 is desirably less than 20 µm with thickness tolerances of less than +/−5 µm. The conductive coating needs to be thin to facilitate thermal conductivity and rapid heat transfer from the wafer chuck to the probe cards; however, it must be thick enough to provide compliant film benefits that provide a buffer and protect the probes from damage as well as contamination during the soak time.

Alternatively, the thermal conductive layer 702 may be laminated as a film onto the surface of the wafer 704; however, flatness and planarity are critical for this application and the very small overtravel.

The heat conductive film 702 may have low tack or poor adhesive properties such that when the probe tip elements are brought into contact very little force is necessary for separating the tips from the material surface after the thermal soak has been completed. For wafer level testing, a temperature range from −60 C up to 200 C can be typically implemented. The HCW can be used across the entire test temperature range that is currently used for wafer level testing. For the elevated temperatures, the polyimide coating can withstand up to 320 C.

The thermal conductive film 702 and the rate of heat conduction through a layer is directly proportional to the temperature difference across the layer and the heat transfer area; however, it is inversely proportional to the thickness of the layer. Simply put, thinnest possible polymer layers will have the best possible thermal conductivity since multiple layers will serially affect the thermal transfer. Adding thermally conductive particles to the polymer matrix will improve the bulk properties of the thin polymer layer and this can be a better strategy for improving the thermal conductivity properties.

For each of the HCW embodiments, the HCW is a conductive device that has a predetermined configuration applicable for the particular pin contact elements, thermal conditions, and a substrate having a predefined form factor which can be readily introduced into the testing apparatus under normal testing operations. For example, different embodiments with different configurations may exist for a known 50 mm×50 mm probe array, a known 75 mm×75 mm probe array, a known 100 mm×100 mm probe array, a known 150 mm×150 mm probe array and a known full wafer or a 300 mm probe array contactor, examples of which are shown in FIG. 3. The probe elements of the probe cards used in the 5 different area arrays shown in FIG. 3 are the same; however, it is the size of the array and the layout of the probes within the array that could be different. The same HCW can be used interchangeably for all 5-area arrays and probe layouts to facilitate soak time reduction. Additionally, the same HCW used for these 5-different arrays could be used for completely different probe elements. For this embodiment, a single HCW could be used in multiple test-cells that are using different probe-element and probe cards to test different semiconductor devices.

The disclosed heat conductive device, such as the HCW, may have an unpatterned surface unlike a conventional patterned substrate that is constrained to specific probe element layouts. The unpatterned surface of the heat conductive device facilitates use with multiple probecard designs within numerous automated test equipment (ATE) tools. The conductive material installed onto the surface of the substrate results in a device that provides enhanced thermal performance characteristics that are not possible with a blank wafer substrate. The material can also be configured to have a plurality of various particles to further enhance the thermal conductivity. The particles may be micro and nanosized thermally conductive particles such as boron-nitride, zinc-oxide, etc., that could be incorporated within the conductive layer. The particles would be encapsulated within the thermally conductive layer as fillers within the matrix. The various particles can have various shapes, such fibers, pyramids, etc., to facilitate packing density. The amount of particle filler can be varied to create a composite with a mixture of 1 to 40 wt % of thermally conductive particles; or until the structural integrity of the polymer layer is compromised. The addition of the particles can reduce the processability, flexibility, and toughness of the layer such that the filler loading is controlled to for attaining the necessary performance properties.

The heat conductive device, that has a shape/configuration that is similar or the same as the devices/wafers, etc. being tested by any testing machine, can be used during the normal operation of the testing machine while it is in manual, semi-automated, and automated handling device and the electrical test equipment. For example, in the manual mode, the heat conductive device may be inserted into the testing machine during any event where the probe card temperature is expected to drop or increase. In the semi-automated example, the need to create thermal stability for the probe card is determined in some manner and then, the testing machine is able to automatically move/place the heat conductive device into the testing machine and perform the operation to maintain or create thermal stability for the probe card. In the automated example, the testing machine may have a computer/processor that has a plurality of lines of computer code that performs a process to determine when the heat conductive device is needed and then moves the heat conductive device into position to maintain or create thermal stability.

Figure 8:
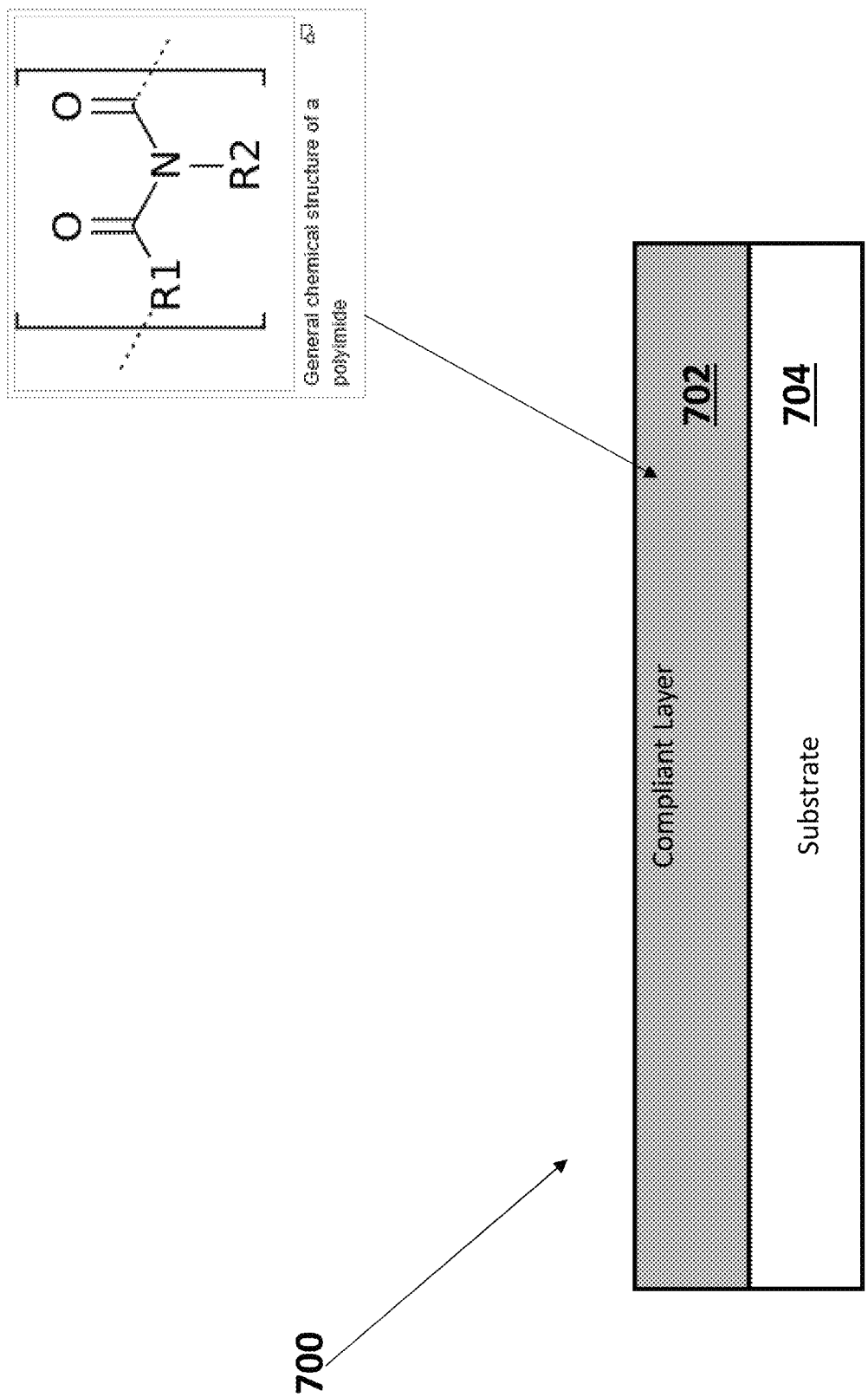
FIG. 8 illustrates another embodiment of the HCW 700 with a different polymer layer that may be used in the HCW.

FIG. 8 illustrates another embodiment of the HCW 700 with a different polymer complaint layer 702 that may be used in the HCW. In this embodiment, the compliant layer 702 may be a high purity polyimide material as shown in FIG. 8. The polyimide is a polymer of imide monomers and polyimides have good thermal stability, good chemical resistance, and excellent mechanical properties.

Figure 9:
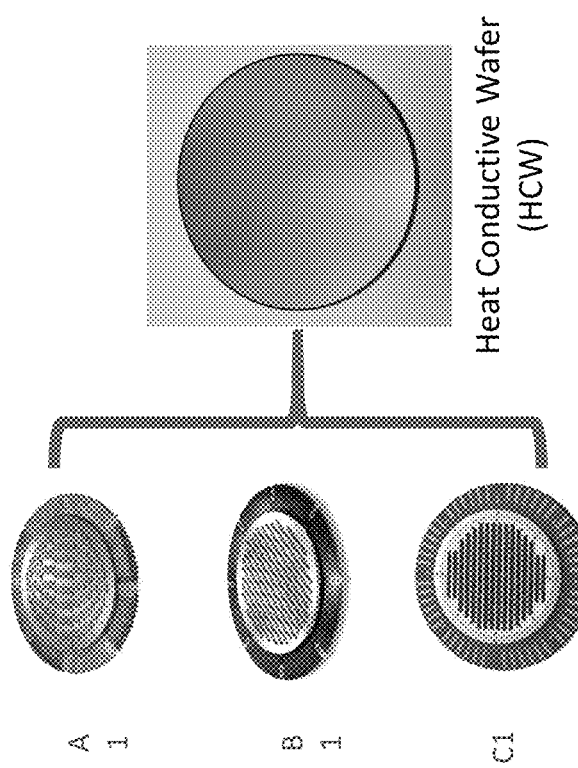
FIG. 9 shows three different probes cards (A1, B1, and C1) and the heat conductive wafer (HCW) with thermally conductive, non-transferring, and compliant film of predetermined properties that has been applied to the surface. The HCW loaded onto the wafer chuck would be positioned directly below the probe-card and a z-overtravel applied until all probes contact the thermally conductive film.

The HCW 700 is built and designed with a thin, compliant, and conductive material layer 702 (an example of the thickness characteristics are provided above) that facilitates efficient thermal transfer such that heating is performed consistently and predictably during maintenance, idle time, during lot change or any event where the probe card temperature is expected to drop or increase. One HCW wafer can be utilized for multiple probe card layouts and probe geometries (i.e., no phase out) across multiple test-cell platforms. The HCW, as shown in FIG. 9, can be used for utilized for the three representative probe cards described above as well as many other probe cards. Regular and repeated use of the heat conductive wafer with the compliant layer will not affect the performance of the contact elements and after utilization of the HCW, subsequent methods for cleaning and maintaining the contact elements prior to probing are not needed. Regular utilization of the HCW for soak time reduction would have significant benefits for reduced cost to test and increased throughput for advanced semiconductor devices.

In various embodiments of the heat conductive device, the conductive layer may have controlled surface functionalization with adjustable behavior that is an effective way for altering the mechanical properties of a surface to achieve specific performance goals such as thermal conductivity, contact surface cleaning, debris removal and collection, and surface texturing. A functional coating with predetermined properties, such as thermal conductivity, thickness, hardness, tack, etc., can be applied to the surface of a wafer to provide a new class of materials that can be tailored and optimized for contact elements and perform a well-defined set of functions. Furthermore, various filler materials can be incorporated into the thickness of the film to further alter and/or enhance the performance such as those particles described above.

The HCW device 700 described above facilitates thermal transfer through both radiation and a conduction mechanisms between the prober wafer chuck and the probe card while protecting the probe elements from damage during contact. The complaint film acts as a protective buffer such that full contact across the entire probe card can be attained at relatively low contact displacements (or z-overtravel). At low overtravel, the forces of the probe elements are minimized but full contact across the wafer is attained without creating any material transference or contamination. The thermally conductive media is a flat, non-featured, non-patterned, and compliant film layer that provides performance characteristics not possible with rigid un-patterned wafer surfaces or rigid patterned wafer surfaces having specific geometries for semiconductor devices.

In one aspect of the method, the HCW may be placed within the automated test equipment, such as a wafer prober, in a predetermined location so that pin elements will interact with the thermally conductive cleaning medium periodically. In an embodiment, a single HCW can be used within the prober for thermally soaking many different types of probe cards as shown in FIG. 9. As such, this device and method would assure the availability of a clean, thermally soaked probe-card for high volume wafer level testing.

In various embodiments of the heat conductive device 700, the heat conductive layer 702 may have a sacrificial top protective layer of material that may be applied before, during, or after the fabrication process to protect and isolate the material surface from contamination during manufacturing process and manual handling operations. The protective sacrificial layer is used to ensure that the surface of the conductive material is free of any contamination that would compromise the performance of the contact elements. The protective sacrificial layer would be removed upon installation into the semiconductor testing equipment. In another embodiment of the heat conductive, the heat conductive layer 702 may formed from thermally conductive materials for added compliance of the materials during probe card soaking. In another embodiment, the may have a some level of particle loading to further enhance the thermal conductivity and heat transfer efficiency. Typical particles that may be incorporated into the material layer are micro and nano-sized thermally conductive particles such as boron-nitride, zinc-oxide, etc., or some other well-known thermally conductive materials. The amount of particle filler can be varied to create a composite with a mixture of 1 to 40 wt % of thermally conductive particles; or until the structural integrity of the polymer layer is compromised.

Figure 10:
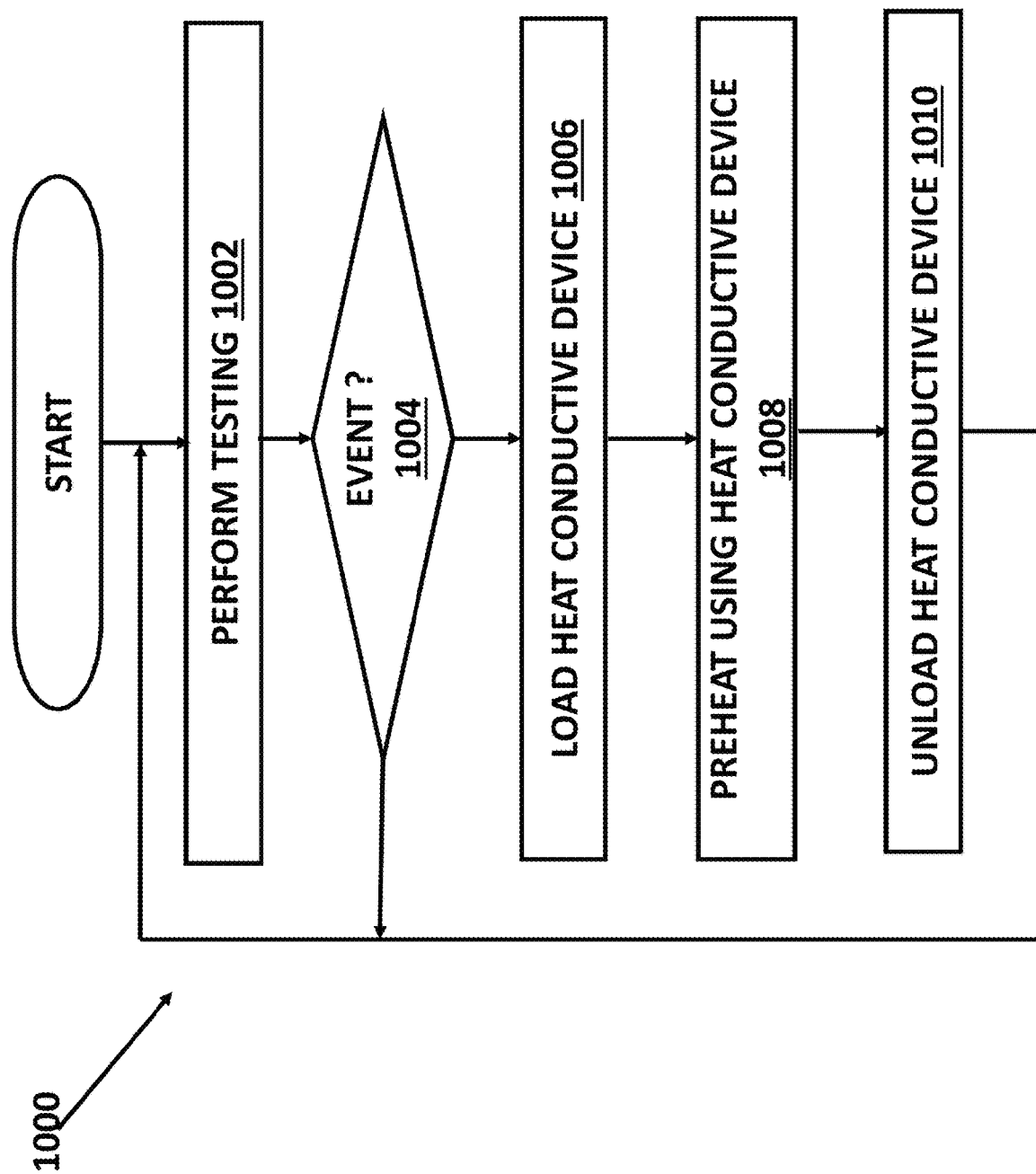
FIG. 10 is a flowchart illustrating a method for using a heat conductive device in a testing apparatus.

FIG. 10 illustrates a method 1000 for thermally conditioning using the heat conductive device that results in a significantly shorter preheat time for the testing machine than with conventional methods. Note that the heat conductive device may be used as part of the normal testing operation of the testing apparatus so that, for example, the probe card(s) of the testing apparatus do not need to be removed from the testing machine while the thermal conditioning is being performed. The testing machine may perform its normal testing operation (1002) and then determine if an event (1004) in which the probe card will change temperature has or is occurring. The event may be detected manually when a lot change occurs for example or it may be automatically detected by a computer system executing a plurality of lines of instructions to perform a detection process in which, for example, the heat conductive device is automatically moved into position when an event that will cause a temperature change in the probe card occurs. If no event has occurred, then the testing machine continues to perform testing (1002).

Figure 11:
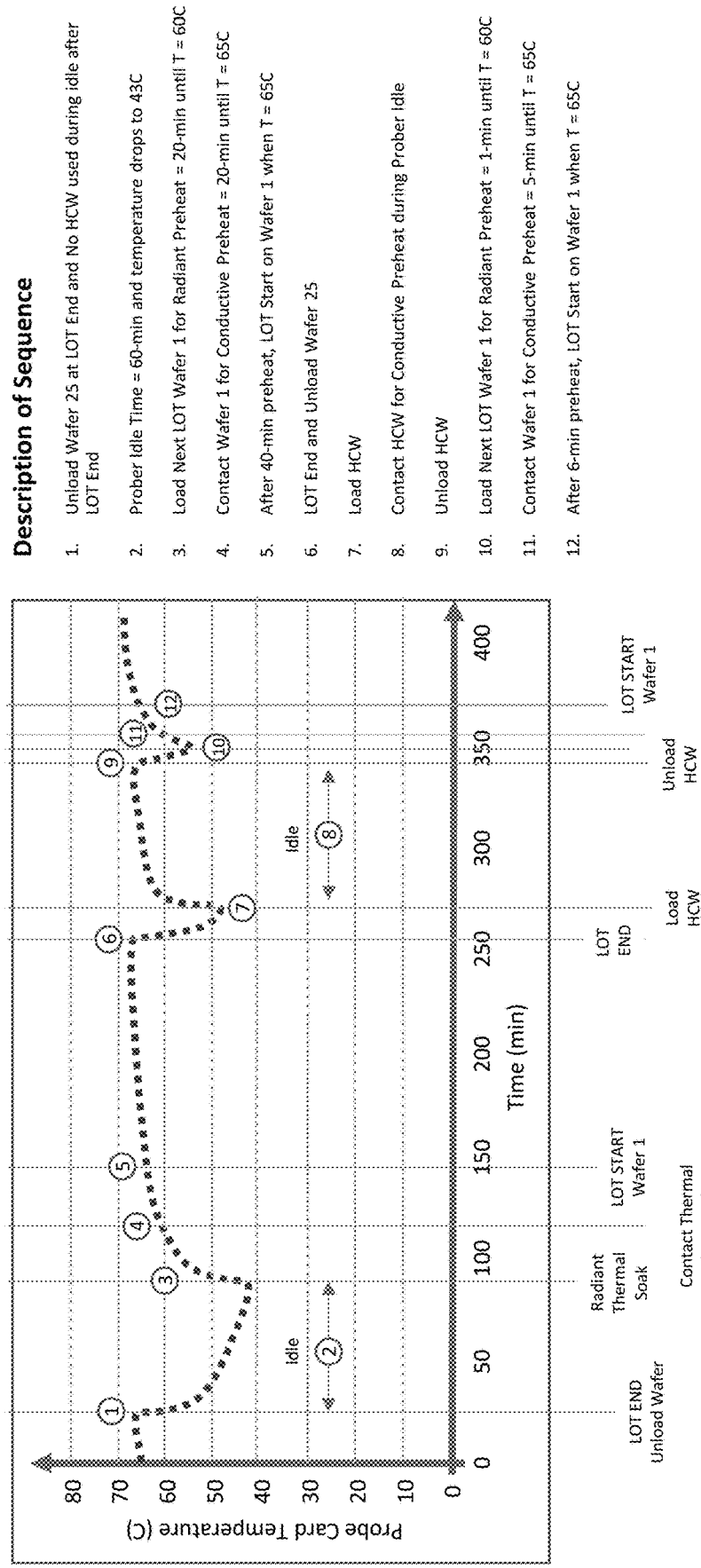
FIG. 11 shows a usage example of the HCW from a high-volume-production environment.

If the event has occurred (examples of the different actions that may cause an event are described above), then the heat conductive device is loaded into the testing machine underneath the probe card (1006). The probe card may then be moved adjacent to the heat conductive device (with the tips of the probe card elements touching the heat conductive device) and the chuck through the heat conductive device may preheat the probe card (1008). As shown in FIGS. 11 and 12 and discussed below, the preheating with the heat conductive device is significantly shorter than typical preheat times and prevents the probe card from changing temperature too much during the event. Once the event has concluded, the heat conductive device may be unloaded (1010) and the testing machine may return to its normal testing operation (1002).

FIG. 11 illustrates an example usage of the heat conductive device (HCW) in a high volume manufacturing test environment in an automated test equipment, such as a wafer prober, in a predetermined location so that pin elements will interact with the thermally conductive cleaning medium periodically. As shown in FIG. 11, the process has a sequence of processes.

Process 1: wafer 25 is unloaded from the wafer chuck for the LOT END execution. In this instance, the HCW is not used and the prober is allowed to remain idle as the next LOT of device wafers is prepared. During the idle time, the wafer chuck remains at the target testing temperature; however, it does not maintain the temperature of the probe card that is required for testing.

Process 2: During the prober idle time of 60-min, the probe card temperature drops to approximately 43 C. The temperature of the probe card during idle is approximately 22 C below the required test temperature.

Process 3: The next lot of 25 Wafer is mounted into the prober for a LOT START execution. Wafer 1 is loaded on the wafer chuck and moved into a position below the probe card for a Radiant Preheat of about 20-min until the probe card reaches the target temperature of T=60 C.

Process 4: Once the probe card is close to the test temperature, Wafer 1 is raised into contact with the probe card for a secondary Conductive Preheat of about 20-min until the probe card reaches the target temperature of T=65 C.

Process 5: After the 40-min Conductive Preheat, probing is initiated on Wafer 1 after the probe card temperature stabilized to a temperature slightly above T=65 C.

Process 6: After probing 25 wafers, LOT END is executed and Wafer 25 is unloaded, previously performed.

Process 7: Rather than allowing the prober to remain idle as the next LOT is prepared, the HCW is loaded onto the wafer chuck and brought into contact with the probe card.

Process 8: During the prober idle time, the HCW maintains contact with the probe card and provides a stable thermal condition through conductive heating.

Process 9: Once the 25 Wafer Lot has been mounted into the prober, the HCW is unloaded and the prober is prepared for device testing.

Process 10: Immediately after the HCW is unloaded, Wafer 1 is loaded on the wafer chuck and moved into a position below the probe card for a Radiant Preheat of less than 1-minute as the probe card is quickly brought to the target temperature of T=60 C.

Process 11: Wafer 1 is raised into contact with the probe card for a secondary Conductive Preheat of less than 6-min as the probe card reaches the target temperature of T=65 C.

Process 12: After less than 6-min preheat, probing is initiated on Wafer 1 after the probe card temperature stabilized to a temperature slightly above T=65 C.

FIG. 12 illustrates the advantages and benefits of the heat conductive device. Specifically, when no heat conductive device is used for thermal stability, the probe card temperature changes (drops to about 40 C in the example for high temperature testing) and it takes approximately 40 minutes to preheat the probe card before being able to restart the testing process. In contrast, when the heat conductive device is used, the probe card temperature remains more stable (closer to the prescribed probing/testing temperature as shown in FIG. 11) and it only takes less than 6 minutes to preheat before resuming the probing/testing after uploaded the heat conductive device. This large difference (8× reduction in soak time) in preheat time means reduced downtime for the prober/tester and more throughput for the tester/problem. The other advantages include the contamination risk and probe wearability.

The methods and apparatus provide one or more advantages including but not limited to thermally soaking contactors and probe cards. While the disclosure has been described with reference to certain illustrative embodiments, those described herein are not intended to be construed in a limiting sense. For example, variations or combinations of steps in the embodiments shown and described may be used in particular cases without departure from the disclosure. Various modifications and combinations of the illustrative embodiments as well as other advantages and embodiments of the disclosure will be apparent to persons skilled in the arts upon reference to the drawings, description, and claims. It is intended that the scope of the disclosure be defined by the claims appended hereto and their equivalents. While the foregoing has been with reference to a particular embodiment of the invention, it will be appreciated by those skilled in the art that changes in this embodiment may be made without departing from the principles and spirit of the disclosure, the scope of which is defined by the appended claims.

The foregoing description, for purpose of explanation, has been with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include and/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general-purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software, and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

What is claimed is:

1. A heat conductive device for use in an automated semiconductor testing machine, the device comprising:
    a substrate that is capable of being handled by a handler mechanism of the automated semiconductor testing machine; and
    a heat conductive layer applied to a top surface of the substrate that maintains or produces thermal stability for a probe card having one or more probe elements that is part of the automated semiconductor testing machine, the heat conductive layer having a compliance that protects the one or more probe elements that are brought into contact with the heat conductive layer during a thermal soak event.

2. The device of claim 1, wherein the heat conductive layer further comprises a polymer layer.

3. The device of claim 2, wherein the polymer is a polyimide layer.

4. The device of claim 3, wherein the polyimide layer has a plurality of particles embedded into the polyimide layer that improve a heat conductivity of the polyimide layer.

5. The device of claim 1, wherein the substrate further comprises a silicon wafer.

6. The device of claim 5, wherein the silicon wafer further comprises a SEMI standard semiconductor silicon wafer.

7. The device of claim 6, wherein the heat conductive layer has a thickness of about 20 µm and the substrate has a thickness of about 775 µm.

8. The device of claim 1 further comprising a sacrificial top layer on top of the heat conductive layer that prevents contamination of the heat conductive layer when not in use.

9. A method for testing a semiconductor device, the method comprising:
    performing testing of a plurality of semiconductor devices using an automated testing machine at a testing temperature different from an ambient temperature, the automated testing machine having a probe card with a plurality of probe elements having a configuration to establish an electric connection with each test site of the semiconductor device;
    determining that an event is occurring in which a temperature of the probe card varies away from the testing temperature;
    moving a heat conductive device into a position in which it touches the plurality of probe elements of the probe card;
    performing heat conduction using the heat conductive device to maintain the plurality of probe elements of the probe card at the testing temperature during the event; and
    performing testing at the testing temperature once the event is completed.

10. The method of claim 9 further comprising reducing a period of time before testing is resumable after the event.

11. The method of claim 10 further comprising loading the heat conductive device onto a wafer chuck to perform the heat conduction.

12. The method of claim 11 further comprising unloading the heat conductive device from the wafer chuck when the event is completed.

13. The method of claim 12, wherein the event is selected from one of a maintenance event, an idle time of the automated testing machine and a lot change process.

14. The method of claim 9, wherein the testing temperature is a temperature higher than the ambient temperature.

15. The method of claim 9, wherein the testing temperature is a temperature lower than the ambient temperature.

16. An automated testing machine, comprising:
    a chuck for holding a semiconductor device being tested by the automated testing machine, the semiconductor device having a plurality of sites through which signals enter or exit the semiconductor device;
    a testing apparatus having a probe card with a plurality of probe elements having a configuration to establish an electric connection with each site of the semiconductor device and perform a test of the semiconductor device at a testing temperature different from an ambient temperature; and
    a heat conductive device having a substrate that is capable of being handled by the chuck of the automated testing machine and a heat conductive layer applied to a top surface of the substrate that maintains or produces thermal stability for a probe card having one or more probe elements that is part of the automated semiconductor testing machine during an event in which a temperature of the probe card varies away from the testing temperature, the heat conductive layer having a compliance that protects the one or more probe elements that are brought into contact with the heat conductive layer during the event.

17. The machine of claim 16, wherein the heat conductive layer further comprises a polymer layer.

18. The machine of claim 17, wherein the polymer is a polyimide layer.

19. The machine of claim 18, wherein the polyimide layer has a plurality of particles embedded into the polyimide layer that improve a heat conductivity of the polyimide layer.

20. The machine of claim 16, wherein the substrate further comprises a silicon wafer.

21. The machine of claim 20, wherein the silicon wafer further comprises a SEMI standard semiconductor silicon wafer.

22. The machine of claim 21 wherein the heat conductive layer has a thickness of about 20 µm and the substrate has a thickness of about 775 µm.

23. The machine of claim 16, wherein the heat conductive device further comprises a sacrificial top layer on top of the heat conductive layer that prevents contamination of the heat conductive layer when not in use.

24. The machine of claim 16, wherein the event is selected from one of a maintenance event, an idle time of the automated testing machine and a lot change process.

25. The machine of claim 16 further comprising a processor and memory and a plurality of lines of computer code executed by the processor so that the processor is configured to:
    determine that the event is occurring;
    move the heat conductive device into a position in which it touches the plurality of probe elements of the probe card; and
    cause the heat conductive device to perform heat conduction to maintain the plurality of probe elements of the probe card at a temperature closer to the testing temperature during the event.

26. The machine of claim 25, wherein the processor is further configured to perform testing at the testing temperature once the event is completed.

27. The machine of claim 26, wherein the processor is further configured to reduce a period of time before testing is resumable after the event.

28. The machine of claim 27, wherein the processor is further configured to cause loading of the heat conductive device onto the chuck to perform the heat conduction and wherein the processor is further configured to cause unloading the heat conductive device from the chuck when the event is completed.

29. The machine of claim 16, wherein the testing temperature is a temperature higher than the ambient temperature.

30. The machine of claim 16, wherein the testing temperature is a temperature lower than the ambient temperature.

* * * * *